US012692603B2

(12) United States Patent
Lange et al.

(10) Patent No.: US 12,692,603 B2
(45) Date of Patent: Jul. 28, 2026

(54) METHOD AND APPARATUS FOR DEPOSITION OF AT LEAST ONE LAYER, OPTICAL ELEMENT AND OPTICAL ARRANGEMENT

(71) Applicant: Carl Zeiss SMT GmbH, Oberkochen (DE)

(72) Inventors: Felix Lange, Giengen an der Brenz (DE); Alexandra Pazidis, Essingen-Lautenburg (DE); Marcel Haertling, Aalen (DE); Alexander Wiegand, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 18/482,472

(22) Filed: Oct. 6, 2023

(65) Prior Publication Data

US 2024/0035163 A1    Feb. 1, 2024

Related U.S. Application Data

(63) Continuation of application No. PCT/EP2022/058426, filed on Mar. 30, 2022.

(30) Foreign Application Priority Data

Apr. 9, 2021    (DE) ..................... 10 2021 203 505.1

(51) Int. Cl.
*C23C 14/00*      (2006.01)
*C23C 14/06*      (2006.01)
(Continued)

(52) U.S. Cl.
CPC .......... *C23C 16/48* (2013.01); *C23C 14/0021* (2013.01); *C23C 14/0694* (2013.01);
(Continued)

(58) Field of Classification Search
None
See application file for complete search history.

(56) References Cited

U.S. PATENT DOCUMENTS 4,910,436 A   *   3/1990   Collins ............. H01J 37/32018
                                         315/111.21
5,367,980 A   *   11/1994   Itom ................. H01L 21/30621
                                         257/E21.097
(Continued)

FOREIGN PATENT DOCUMENTS

DE      102005017742 A1    10/2006
DE      102018211499 A1     1/2020
(Continued)

OTHER PUBLICATIONS

Willey et al. "Stable, Durable, Low-Absorbing, Low-Scattering MgF2 Films without Heat or Added Fluorine", Proceedings of SPIE; [Proceedings of SPIE ISSN 0277-786X vol. 10524], SPIE, US, vol. 10691, Jun. 5, 2018 (Jun. 5, 2018), pp. 1069 IOC-1069 (Year: 2018).*
(Continued)

*Primary Examiner* — Jose I Hernandez-Kenney
(74) *Attorney, Agent, or Firm* — Edell, Shapiro & Finnan, LLC

(57) ABSTRACT

The disclosed techniques relate to a method for depositing at least one layer composed of an ionically bonded solid on a substrate, comprising the following steps: converting a coating material to the gas phase and depositing the coating material converted to the gas phase on the substrate. The layer is irradiated with UV/VIS light during the deposition. The disclosed techniques also relate to an apparatus for implementing the disclosed method and optical elements and devices created using the disclosed method.

12 Claims, 4 Drawing Sheets

(51) Int. Cl.

| | | |
|---|---|---|
| *C23C 14/28* | (2006.01) |
| *C23C 16/30* | (2006.01) |
| *C23C 16/40* | (2006.01) |
| *C23C 16/48* | (2006.01) |
| *C30B 23/00* | (2006.01) |
| *C30B 30/00* | (2006.01) |
| *G02B 5/08* | (2006.01) |
| *G02B 13/14* | (2006.01) |
| *G03F 7/00* | (2006.01) |
| *C23C 16/455* | (2006.01) |

(52) U.S. Cl.
CPC .............. *C23C 14/28* (2013.01); *C23C 16/30* (2013.01); *C23C 16/40* (2013.01); *C23C 16/482* (2013.01); *C23C 16/483* (2013.01); *C30B 23/00* (2013.01); *C30B 30/00* (2013.01); *G02B 5/0891* (2013.01); *G02B 13/143* (2013.01); *G03F 7/70958* (2013.01); *C23C 16/45536* (2013.01)

(56) References Cited

U.S. PATENT DOCUMENTS

| | | | | |
|---|---|---|---|---|
| 6,647,167 B1 * | 11/2003 | DeShazer | ............... | G02F 1/293 |
| | | | | 385/20 |
| 7,798,096 B2 | 9/2010 | Mahajani et al. | | |
| 2003/0108665 A1 | 6/2003 | Biro et al. | | |
| 2004/0006249 A1 | 1/2004 | Hoshino et al. | | |
| 2004/0154542 A1 | 8/2004 | Yamazaki et al. | | |
| 2013/0122252 A1 | 5/2013 | Ode et al. | | |
| 2016/0189923 A1 * | 6/2016 | Juodkazis | ............. | H01J 37/263 |
| | | | | 250/492.1 |
| 2017/0032974 A1 * | 2/2017 | Armour | ............... | H10D 62/824 |
| 2021/0132269 A1 | 5/2021 | Forcht et al. | | |
| 2023/0147463 A1 | 5/2023 | Lange et al. | | |

FOREIGN PATENT DOCUMENTS

| | | | |
|---|---|---|---|
| DE | 102018221190 A1 | 6/2020 | |
| DE | 102020208044 A1 | 12/2021 | |
| DE | 102021200490 A1 | 12/2021 | |
| DE | 102021201477 A1 | 2/2022 | |
| DE | 102021202848 A1 | 9/2022 | |
| JP | H0536613 A | 2/1993 | |
| JP | 11172421 A | 6/1999 | |
| JP | 2003161803 A | 6/2003 | |
| JP | 2003193231 A2 | 7/2003 | |
| JP | 2012219320 A | 11/2012 | |
| WO | 2005021824 A2 | 3/2005 | |
| WO | 2015163875 A1 | 10/2015 | |
| WO | 2020011853 A1 | 1/2020 | |
| WO | WO-2020081574 A1 * | 4/2020 | ............. C23C 16/40 |
| WO | 2020115112 A2 | 6/2020 | |
| WO | 2022200054 A1 | 9/2022 | |

OTHER PUBLICATIONS

Masoud et al., "VUV Emissions froma Cylindrical DBD in Ar and Ar/N2 and Ar/air Mixtures", Journal of Physics D Applied Physics, Jan. 2005, 12 pages.

Tiwald et al., "Ab initio perspective on the Mollwo-Ivey relation for F centers in alkali halides", Physical Review B 92, (2015), 11 pages.

Wood et al., "Vacuum ultraviolet loss in magnesium fluoride films", Applied Optics, vol. 23, No. 20, Oct. 15, 1984, 6 pages.

Willey et al., "Stable, durable, low-absorbing, low-scattering MgF2 films without heat or added fluorine", Advances in Optical Thin Films Vi, Proc. of SPIE vol. 10691, (2018) 11 pages.

Bischoff et al., "Plasma-assisted deposition of metal fluoride coatings and modeling the extinction coefficient of as-deposited single layers", Applied Optics, vol. 50, No. 9, Mar. 20, 2011, 7 pages.

Mollwo, "Regarding the absorption spectra of photochemically discolored alkali metal halide crystals" presented by R.W. Pohl at the meeting on May 22, 1931, 4 pages.

International Search Report, PCT/EP2022/058426, Jul. 13, 2022, 4 pages.

German Office Action English translation, Application No. 10 2021 203 505.1, Nov. 15, 2021, 6 pages.

International Preliminary Report on Patentability and the Written Opinion, PCT/EP2022/058426, Oct. 10, 2023, 9 pages.

Japanese Office Action with English translation, Application No. 2023-561867, Nov. 19, 2024, 16 pages.

Willey et al., "Stable, durable, low-absorbing, low scattering MgF2, films without heat or added fluorine" SPIE, vol. 10691, 11 pages.

Chinese Office Action with English translation, Application No. 202280040142.3, Jul. 31, 2025, 30 pages.

* cited by examiner

METHOD AND APPARATUS FOR DEPOSITION OF AT LEAST ONE LAYER, OPTICAL ELEMENT AND OPTICAL ARRANGEMENT

CROSS-REFERENCE TO RELATED APPLICATION

This is a Continuation of International Application PCT/EP2022/058426, which has an international filing date of Mar. 30, 2022, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2021 203 505.1 filed on Apr. 9, 2021.

FIELD

The disclosed techniques relate to a method for depositing, in particular for depositing by physical vapor deposition, at least one layer composed of an ionically bonded solid on a substrate. The techniques include the following steps: converting a coating material to the gas phase and depositing the coating material converted to the gas phase on the substrate. The disclosed techniques also relate to an apparatus for depositing at least one layer composed of an ionically bonded solid. The apparatus includes a coating chamber having a mount for a substrate, and also a coating source designed to convert a coating material to the gas phase and to deposit it as a layer on the substrate within the coating chamber. The disclosed techniques also relate to an optical element for reflecting and/or transmitting radiation in the VUV wavelength range, and to an optical arrangement for the VUV wavelength range which has at least one such optical element.

BACKGROUND

When a difference in electronegativity is 1.7 or more, the type of bond is called an ionic bond. Examples of ionically bonded solids are oxides and fluorides, including the alkali metal halides and alkaline earth metal halides. Converting a coating material to the gas phase and depositing the coating material converted to the gas phase on a substrate are the characteristic features of physical vapor deposition. Corresponding methods include thermal evaporation and electron beam evaporation, in each case with or without plasma assistance, sputtering deposition, ion beam sputtering and arc evaporation.

In this application, the VUV wavelength range is understood to mean the wavelength range of electromagnetic radiation between 115 nm and 190 nm. The VUV wavelength range is particularly important for microlithography. Radiation in the VUV wavelength range is thus used in, for example, projection exposure apparatuses and wafer or mask inspection apparatuses.

Optical elements having an ionically bonded solid in the form of at least one fluoride layer or a fluoride substrate are often used in such apparatuses. Highly reflective optical elements for the VUV wavelength range typically have a fluoride layer in order to, for example, protect an underlying metal layer (which reflects the radiation is reflected) against oxidation. Layer stacks composed of different fluorides or fluorides and oxides may additionally be used for the reflective coating or antireflective coating of optical elements. Owing to the high absorption of most oxides in the VUV wavelength range, however, the scope is generally restricted here to a small number of materials, for example to $SiO_2$. Transmissive optical elements for the VUV wavelength range, such as laser chamber windows of excimer lasers, for example, are often likewise based on a fluoride substrate.

However, high radiation intensities such as those required in wafer or mask inspection apparatuses and projection exposure apparatuses lead to a degradation of the fluorides and of the optical elements in general, which shortens the lifetime thereof. This degradation may be counteracted by way of high-density fluoride layers. By way of example, the exteriors of laser chamber windows may be sealed by deposition of high-density fluoride layers.

High-density layers composed of ionically bonded solids, e.g., fluoride layers, may be produced by way of plasma-assisted deposition methods, e.g., by sputtering deposition, such as ion beam sputtering (IBS), plasma ion-assisted deposition (PIAD) or plasma-enhanced atomic layer deposition (PEALD). However, if ionically bonded solids, including oxides and fluorides, are deposited in a plasma-assisted manner, then the ion bombardment also has the effect of increased production of crystal defects, e.g., defects in the form of color centers, which lead to higher extinction in comparison with, for example, purely thermally deposited layers. Moreover, a plasma likewise emits UV/VUV radiation. The short-wave portion of this radiation can likewise produce crystal defects by way of single-photon processes, which disadvantageously affects the optical performance and/or the irradiation stability of the deposited layers.

The literature describes that subsequent irradiation with UV light may improve the optical performance of fluorides deposited with plasma (ion) assistance in the DUV wavelength range. By way of example, the article "Plasma-assisted deposition of metal fluoride coatings and modelling the extinction coefficient of as-deposited single layers", M. Bischoff et al., Appl. Opt. 50, 232-238 (2010) describes the aftertreatment of metal fluoride layers with UV radiation, which were deposited by means of plasma-assisted electron beam deposition. The article showed that the initially poor transmission of $LaF_3$, $MgF_2$ and $AlF_3$ layers in the DUV wavelength range may be significantly increased by this aftertreatment. During this subsequent irradiation, color centers are bleached and presumably unsaturated bonds are (superficially) post-oxidized.

While this procedure is practicable for oxides in general and for fluorides for use in the DUV wavelength range (i.e., at wavelengths greater than 190 nm), it generally fails for fluorides in the VUV wavelength range. In the latter case, oxidation leads to the loss of optical performance.

U.S. Pat. No. 7,798,096 B2 describes the use of UV light for assisting the deposition of high-k dielectrics by means of chemical vapor deposition or atomic layer deposition. In that case, the UV light is used to excite or ionize the process gas and thereby to initiate or amplify surface reactions during the deposition.

DE 10 2018 221 190 A1 discloses the nanostructuring of a substrate for transmission of radiation in the FUV/VUV wavelength range by introducing an energy input, e.g., by irradiation with UV/VUV radiation. In such cases, the substrate is crystalline; such as an $MgF_2$ single crystal. The irradiation enables the surface of the $MgF_2$ single crystal to be reorganized in such a way that an antireflection effect occurs.

DE102020210195.7 discloses a method for operating a microlithographic optical arrangement which has an optical element having a fluoride coating or composed of a fluoride substrate. In such cases, during operation the optical element is irradiated with UV light with wavelengths which are greater than the wavelength of working light of the optical arrangement, which is less than or equal to 300 nm. This irradiation anneals defects of the fluoride coating.

DE102020208044.5 discloses a method for producing an optical element, for example a mirror, window or beam splitter, for the VUV wavelength range having a coating with a fluorine scavenger layer, which may be applied to a fluoride layer. The purpose of the fluorine scavenger layer is to prevent the degradation of the fluoride layer, with an attendant longer lifetime of the optical element. The underlying mechanism is a significant reduction of the mobility of interstitial fluorine atoms by so-called fluorine scavengers in the fluorine scavenger layer.

DE102021200490.3 describes the irradiation of a metal fluoride layer with radiation at at least one wavelength of less than 300 nm. The metal fluoride layer is applied on a metal layer of a reflective optical element for use in the VUV wavelength range. The irradiation is provided after the coating has been applied. The irradiation results in a passivation of the metal fluoride layer which counteracts degradation of the metal layer.

DE 10 2005 017 742 A1 discloses a method for coating a substrate by plasma-assisted deposition of a coating material, for example a fluoride material. The plasma contains ions having a relatively low effective ion energy, while the effective energy per molecule is relatively high, which is intended to lead to low absorption and contamination of a deposited layer with, at the same time, a high packing density.

US2013/0122252 A1 discloses a method for ion beam sputtering of metal fluoride layers in the presence of dissociated fluorine gas.

JP11172421A and JP2003193231A2 describe further variants of the physical vapor deposition of fluoride layers. US 2004/0006249 A1 discloses fluoridization as aftertreatment of fluoride layers.

SUMMARY

Against this background, it is an object of the disclosed techniques to provide a method and an apparatus for depositing layers composed of an ionically bonded solid, and also an optical element and an optical arrangement that include optical elements, providing the devices with high optical performance.

These objects may be achieved in accordance with a first aspect via a method of the type mentioned in the introduction in which the at least one layer is irradiated with UV/VIS light during the deposition.

What may be achieved by the irradiation of the layer(s) with regenerative UV/VIS light during the deposition is that crystal defects that arise during the deposition are instantaneously annealed, which results in a lower extinction coefficient of the deposited layer(s) in comparison with deposition without irradiation with UV/VIS light. A higher transmission and a longer lifetime of the deposited layers and of the substrates or optical elements coated therewith are obtained as a result, which is of central importance particularly in the case of the high radiation intensities in microlithography.

In contrast thereto, a subsequent treatment of crystal defects has the disadvantage that reoxidation or refluorination may generally take place only superficially. Bulk damage that has occurred during the coating process is generally not repairable, however.

Within the meaning of this disclosure, UV light is understood to be electromagnetic radiation in a wavelength range of between 100 nm and 380 nm. Within the meaning of this disclosure, VIS light is understood to be radiation in a wavelength range of between 380 nm and 830 nm. Within the meaning of this application, UV/VIS light is understood to be radiation in a wavelength range of between 100 nm and 380 nm (UV light) and/or between 380 nm and 830 nm (VIS light). The UV/VIS wavelength range may be limited further and may lie between 170 nm and 730 nm, for example. The irradiation with UV/VIS light is generally not provided in the entire UV/VIS wavelength range, but rather in one or a plurality of selected spectral ranges. A respective spectral range may optionally comprise just a single wavelength, for example if the UV/VIS light is generated by a laser source, e.g., by an excimer laser (see below).

In one variant of the disclosed techniques, the UV/VIS light has a first spectral range for annealing at least one crystal defect of the ionically bonded solid, which at least partly overlaps an absorption range of the at least one crystal defect, the first spectral range preferably comprising an absorption energy of the crystal defect, more preferably a mean energy of the first spectral range deviating from the absorption energy of the crystal defect by not more than 0.5 eV, in particular by not more than 0.25 eV.

The absorption energy of the crystal defect is understood to mean that energy or wavelength at which the absorption coefficient of the crystal defect in the ionically bonded solid material has a maximum. The absorption range of the crystal defect is understood to mean a range in which the absorption coefficient is greater than half the value at the maximum (FWHM) of the absorption coefficient. The absorption energies of crystal defects of three fluorides that are relevant to the present applications are, by way of example: $MgF_2$: 260 nm (4.77 eV), $AlF_3$: 190 nm (6.53 eV), 170 nm (7.29 eV), $LaF_3$: 459 nm (2.7 eV), 564 nm (2.2 eV), 729 nm (1.7 eV).

In one specific example of this variant, the crystal defect forms a color center, in particular an F-center. Color centers are crystal defects which absorb visible light, inter alia. F-centers are particularly simple color centers. In the case of an F-center, the vacancy of an anion is occupied by an electron. Other color centers are M-centers and R-centers, for example, which are each composed of groups of F-centers. As a result of the irradiation with the UV/VIS light during the deposition, electrons are removed from the crystal defects and the lattice sites thus become attractive for newly arriving atoms and/or anions, such as $F^-$ or $O^{2-}$, for example. Depth damage of the layer is instantaneously counteracted as a result.

In a further variant of the disclosed techniques, the first spectral range is chosen based on a relationship between the absorption energy of the at least one crystal defect and the anion-cation distance of the ionically bonded solid. One example of a corresponding relationship is the Mollwo-Ivey rule (cf. the article "Über die Absorptionsspektra photochemisch verfärbter Alkalihalogenid-Kristalle", E. Mollwo, Nachrichten von der Gesellschaft der Wissenschaften zu Göttingen, 97-100 (1931) and the article "Ab initio perspective on the Mollwo-Ivey relation for F centers in alkali halides", P. Tiwald et al., Phys Rev B 92 (2015) 144107).

The Mollwo-Ivey rule was originally established for F-centers in alkali metal halides and states that the absorption energy, $E_{abs}$, of the crystal defect results from the lattice constant, a, by way of a simple power law with an exponent, n, and a constant, C:

$$E_{abs} = Ca^{-n}.$$

Although this rule was formulated only for cubic systems, it may be generalized within certain limits to ionically bonded solids having a more complex crystal structure and thus allows a prediction of the spectral range in which the irradiation with UV/VIS light should be provided in order to anneal the crystal defect. The exponent n and the constant C should be adapted in the course of such a generalization.

In a further variant of the disclosed techniques, the first spectral range has a mean energy which is greater than the absorption energy of the at least one crystal defect by not more than 1 eV, preferably by not more than 1.5 eV. If the energy of the UV/VIS light is significantly greater, typically at least 1 eV or 1.5 eV greater, than the absorption energy of the crystal defect, production of additional crystal defects and/or defect conversion increasingly occur(s). It is therefore advantageous to impose an upward limitation on the energy of the first spectral range of the UV/VIS light. A downward limitation of the energy or the bandwidth of the first spectral range is not absolutely necessary, but an excessively low energy of the UV/VIS light used in the irradiation generally does not make it possible to anneal the crystal defect and should therefore be avoided.

In a further variant of this method, the UV/VIS light has a second spectral range for mobilizing atoms at the surface of the ionically bonded solid, the second spectral range lying in an energy range of between 75% and 100%, preferably between 80% and 95%, of a bandgap energy of the ionically bonded solid.

High-energy light near the band edge of the ionically bonded solid makes it possible for surface atoms or atoms to be mobilized, without these atoms being desorbed, as described for example in DE 10 2018 221 190 A1, cited in the introduction. Irradiation with UV/VIS light near the band edge thus potentially has the same effect as increasing the temperature during coating, the influence of which on layer growth is described in so-called structure-zone models, for example. On account of the increased surface mobility of the atoms, it is potentially possible to overcome Ehrlich-Schwöbel barriers more easily and thus to attain larger grains and fewer grain boundaries, which leads to a lower extinction coefficient.

In a further variant of the disclosed techniques, the mean energy of the first spectral range and/or of the second spectral range of the UV/VIS light is set or has been set to less than 0.5 eV, preferably less than 0.25 eV, and/or a bandwidth of the first spectral range and/or of the second spectral range of the UV/VIS light is restricted or has been restricted to less than 1.5 eV, preferably to less than 0.75 eV.

For the irradiation with UV/VIS light in the first and/or second spectral range, it is possible to use light sources which are not tunable, for example laser sources, e.g., excimer lasers, but also VUV LEDs. In this case, the light source(s) is/are chosen so as to satisfy the above-described conditions with respect to the mean energy and the bandwidth. Alternatively, it is possible to use one or a plurality of tunable light sources for the irradiation with the UV/VIS light. In this case, the mean energy may be set and/or the bandwidth may be suitably restricted. Within the meaning of this application, the mean energy of a spectral range is understood to be the central wavelength of the spectral range. Within the meaning of this application, the bandwidth of a spectral range is understood to be the full width half maximum. In principle, it is also possible to use a single wideband light source for the irradiation with UV/VIS light and to generate the desired spectral ranges with the aid of suitable wavelength filters.

In a further variant of the disclosed techniques, a ratio between the intensity of the UV/VIS light in the first spectral range and the intensity of the UV/VIS light in the second spectral range is more than 3:1, preferably more than 6:1. The intensity of the UV/VIS light in the first spectral range must be set such that the rate at which the crystal defects anneal is greater than the generation rate at which new crystal defects arise. In the case of ion-assisted deposition, the generation rate is composed of the defect formation as a result of ion bombardment and the defect formation as a result of the VUV-driven single-photon processes. If UV/VIS light in the second spectral range near the band edge of the ionically bonded solid, for example the fluoride or oxide, is used for the irradiation, it is advantageous to correspondingly increase the intensity in the first spectral range.

In a further variant of the disclosed techniques, the ionically bonded solid is an oxide or a fluoride. An oxide that is suitable for the VUV wavelength range is $SiO_2$, for example. Suitable fluorides are, for example, magnesium fluoride, aluminum fluoride, sodium fluoride, lithium fluoride, chiolite, cryolite, erbium fluoride, neodymium fluoride, gadolinium fluoride, dysprosium fluoride, samarium fluoride, holmium fluoride, hafnium fluoride, lanthanum fluoride, europium fluoride, lutetium fluoride, cerium fluoride, barium fluoride, or yttrium fluoride. These fluorides have low absorption and comparatively high radiation resistance in the VUV wavelength range. For the deposition of a multilayer coating having two or more different fluorides on a substrate, it is generally, during the deposition of each individual layer, to carry out an irradiation with a specific light source or a specific first and/or second spectral range adapted to the material to be deposited in each case.

In a further variant of the disclosed techniques, the deposition is provided in a plasma-assisted and/or ion-assisted manner. As has been described above, plasma-assisted and/or ion-assisted methods may be used for the deposition of a layer composed of an ionically bonded solid having a high density. Corresponding methods are, for example, sputtering deposition, arc evaporation, ion beam sputtering and plasma-enhanced atomic layer deposition (ALD). However, the plasma generally likewise emits radiation in the UV/VUV range. The short-wave portion of this radiation may produce crystal defects by way of single-photon processes, which disadvantageously affects the optical performance, the optical stability or irradiation stability of the layers. In general, however, spectral ranges of the radiation emitted by the plasma may also themselves have a regenerating effect, which should be taken into account in fine tuning of the intensities of both the spectral ranges mentioned above.

Crystal defects that arise during the plasma-assisted and/or ion-assisted coating may be instantaneously regenerated by the irradiation with the UV/VIS light. The combination of plasma assistance and/or ion assistance with irradiation with the UV/VIS light thus makes it possible to deposit layers having a high density and at the same time a low extinction coefficient.

In a further variant of the disclosed techniques, the deposition is performed in the presence of at least one reactive gas. The deposition is typically performed in an interior of a coating chamber to which the reactive gas is fed via a gas inlet.

In one specific example of this variant, the at least one reactive gas is selected from the group comprising: $F_2$, $O_2$, $NF_3$, $XeF_2$, $SF_6$, $CF_4$, $NH_3$. Preferably, the reactive gas contains $F_2$ and/or $O_2$. Particularly during plasma- or ion-assisted processes, the reactive gas serves to maintain the stoichiometry of the deposited layer.

In a further variant of the disclosed techniques, the deposition is performed at a pressure in the range of between $10^{-6}$ mbar and $10^{-2}$ mbar. The deposition is generally carried out under vacuum conditions in the coating chamber. The (total) pressure during deposition is generally determined by the sputtering gas or by the (process) gas to be ionized. This gas is generally a noble gas, often Ar. For the case where a reactive gas is used during the deposition, it is metered in only in amounts small enough to counteract the substoichiometry (preferential sputtering of light elements, e.g., O or F).

The object mentioned above may also be achieved in accordance with an apparatus of the type mentioned in the introduction which comprises one or a plurality of UV/VIS light sources for irradiating the layer with UV/VIS light during the deposition. With regard to the advantages achieved with the apparatus and its examples described below, reference should be made to the above explanations regarding the method and its variants. The UV/VIS light source may be a light source designed for emitting UV light (UV light source) or for emitting VIS light (VIS light source). It is also possible for the light source to be designed for emitting both UV light and VIS light.

In one example, at least one of the one or more UV/VIS light sources is spectrally tunable. Tunable UV/VIS light sources are particularly well-suited to the disclosed techniques because their spectrum may easily be adapted to different crystal defects and different materials. In particular, their spectrum may be set such that defect conversion does not occur, nor are new crystal defects formed. Suitable tunable UV/VIS light sources are wideband light sources which, for example, make possible downstream wavelength selection. A $D_2$ gas discharge lamp with downstream wavelength selection may be used for UV light, for example. A plasma light source may also be used for this purpose.

In a further example of the disclosed techniques, the one or at least one of the plurality of UV/VIS light sources is designed to emit UV/VIS light in a first spectral range for annealing at least one crystal defect of the ionically bonded solid, the first spectral range at least partly overlapping the absorption range of the at least one crystal defect, and the first spectral range preferably comprising an absorption energy of the crystal defect. The (at least one) UV/VIS light source may be designed to alter the central wavelength and/or the bandwidth of the emitted UV/VIS light, but a UV/VIS light source for which the central wavelength and the bandwidth are fixedly predefined may also be used.

In a further example, the one or at least one of the plurality of UV/VIS light sources is designed to emit UV/VIS light in a second spectral range for mobilizing atoms at the surface of the ionically bonded solid, said second spectral range lying in an energy range of between 75% and 100%, preferably between 80% and 95%, of a bandgap energy of the ionically bonded solid.

In one case, a first UV/VIS light source is designed to emit light in the first spectral range and a second UV/VIS light source is designed to emit UV/VIS light in the second spectral range. The irradiation in the first and second spectral ranges is generally performed synchronously, that is to say that both UV/VIS light sources simultaneously emit the UV/VIS light in the respective spectral range.

In a further example, the apparatus comprises a plasma source and/or an ion source in order to enable a plasma-assisted and/or ion-assisted deposition.

In a further example, the apparatus has a feed feeding at least one reactive gas into the coating chamber. The at least one reactive gas fed in may be selected for example from the group comprising: $F_2$, $O_2$, $NF_3$, $XeF_2$, $SF_6$, $CF_4$, $NH_3$.

A further aspect of the disclosed techniques relates to an optical element for reflecting and/or transmitting radiation in the VUV wavelength range, comprising a substrate coated with at least one layer composed of an ionically bonded solid, wherein the at least one layer was deposited according to the method described above and/or via the apparatus described above. The optical element may be a transmissive optical element, for example the laser chamber window of an excimer laser. In this case, the exterior of the laser chamber window is generally coated with a high-density fluoride layer. However, the optical element may also be a reflective optical element, for example a mirror serving for deflecting or focusing radiation in the VUV wavelength range, or a beam splitter serving both for transmitting and for reflecting radiation in the VUV wavelength range.

A further aspect of the disclosed techniques relates to an optical arrangement for the VUV wavelength range, in particular a VUV lithography apparatus or a wafer inspection system, comprising at least one optical element as described above. The optical arrangement may be, for example, a (VUV) lithography system, a wafer or mask inspection system, a laser system, etc.

Further features and advantages of the disclosed techniques will become apparent from the following description of specific examples of the disclosed techniques with reference to the figures of the drawing, which show details of the disclosed techniques, and from the claims. The individual features may each be realized individually by themselves or as a plurality in any desired combination in a variant of the disclosed techniques.

BRIEF DESCRIPTION OF THE DRAWINGS

Examples of the disclosed techniques are illustrated in the schematic drawing and are explained in the following description. In the figures.

DETAILED DESCRIPTION

Figures 1, 3:
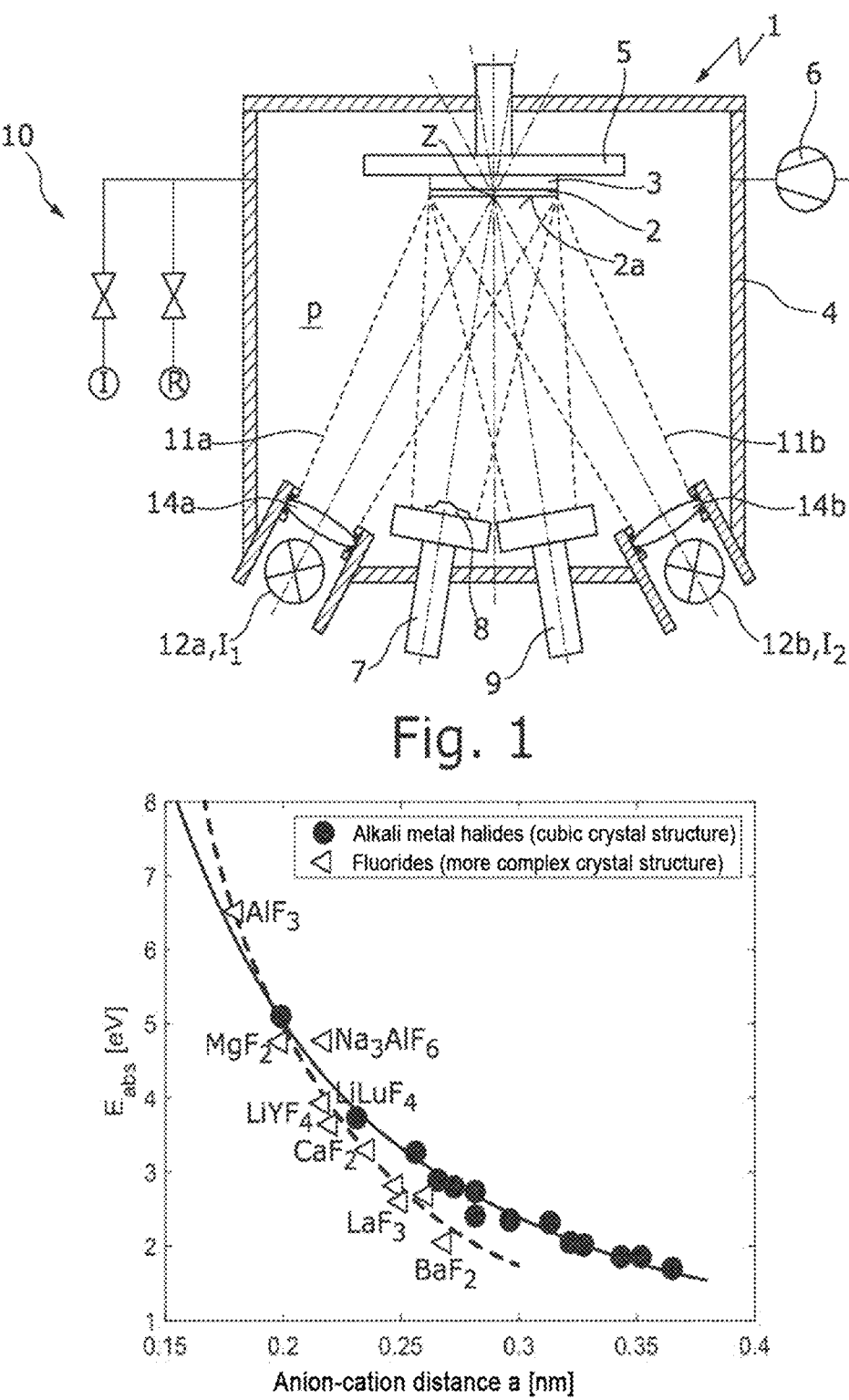
FIG. 1 shows a schematic illustration of an apparatus for depositing layers on a substrate, the apparatus comprising two UV light sources for emitting UV light in two spectral ranges.
FIG. 3 shows the dependence of the absorption energy of crystal defects on the anion-cation distance for various fluorides.

FIG. 1 shows an apparatus 1 for depositing one or a plurality of layers 2 on a substrate 3. For this purpose, the apparatus 1 includes a coating chamber 4 in the form of a vacuum chamber, in which a mount 5 (manipulator), in the form of a rotary table, is provided for the substrate 3. An electrical potential (bias) may be applied to the mount 5, for example in order to accelerate ions from a plasma in the direction of the substrate 3. A vacuum pump 6 generates a vacuum in an interior of the coating chamber 4.

The apparatus 1 has a coating source 7 designed to convert a coating material 8 to the gas phase and to deposit it as a layer 2 on the substrate 3 within the coating chamber 4. In the example shown, the coating material 8 is an ionically bonded solid in the form of a fluoride, more precisely magnesium fluoride. However, the coating material 8 may also be some other ionically bonded solid, e.g., an oxide. In order to convert the coating material 8 to the gas phase, the coating source 7 may be designed in various ways, for example as a thermal evaporator, as a sputtering source or as an electron beam evaporator. It is also possible for the apparatus 1 to have two or more coating sources 7 in order to deposit one or a plurality of layers 2 on the substrate 3.

The deposition of the layer 2 on the substrate 3 (or on a further layer already applied on the substrate 3) may be performed without plasma and/or ion assistance. In order to produce a layer 2 having a high density, however, it is advantageous if the deposition of the layer 2 is performed in an ion-assisted and/or plasma-assisted manner. In the example shown in FIG. 1 for plasma-assisted deposition, the apparatus 1 has a plasma source 9 designed for generating an argon plasma. As an alternative or in addition to one or a plurality of plasma source(s) 9, the apparatus 1 may also have one or a plurality of ion source(s), the illustration of which has been dispensed with in FIG. 1.

In order to maintain the stoichiometry of the deposited layer 2 during the plasma-assisted or plasma ion-assisted deposition, the deposition may be performed in the presence of at least one reactive gas R. The apparatus 1 has a feed 10 feeding the at least one reactive gas R into the coating chamber 4. The feed 10 includes a valve arrangement besides a gas inlet in the coating chamber 4, said valve arrangement enabling a controlled feed of the reactive gas R from a gas reservoir into the coating chamber 4. The reactive gas R fed in may be for example a gas containing $F_2$ and/or $O_2$, e.g., $XeF_2$, $NF_3$, $SF_6$ or $CF_4$, but also some other type of reactive gas, for example $NH_3$.

The feed 10 also has a further valve arrangement serving for the controlled feed of an inert gas I from a further gas reservoir into the coating chamber 4. The inert gas I may be, for example, a noble gas, e.g., argon, which may serve inter alia for ventilating the coating chamber 4 prior to opening or for setting the pressure p in the interior of the coating chamber 4.

The pressure p in the interior of the coating chamber 4 is generally between approximately $10^{-6}$ mbar and approximately $10^{-2}$ mbar during the deposition. The pressure p is substantially determined by the partial pressure of the inert gas I and/or reactive gas R admitted into the coating chamber 4.

Figure 2:
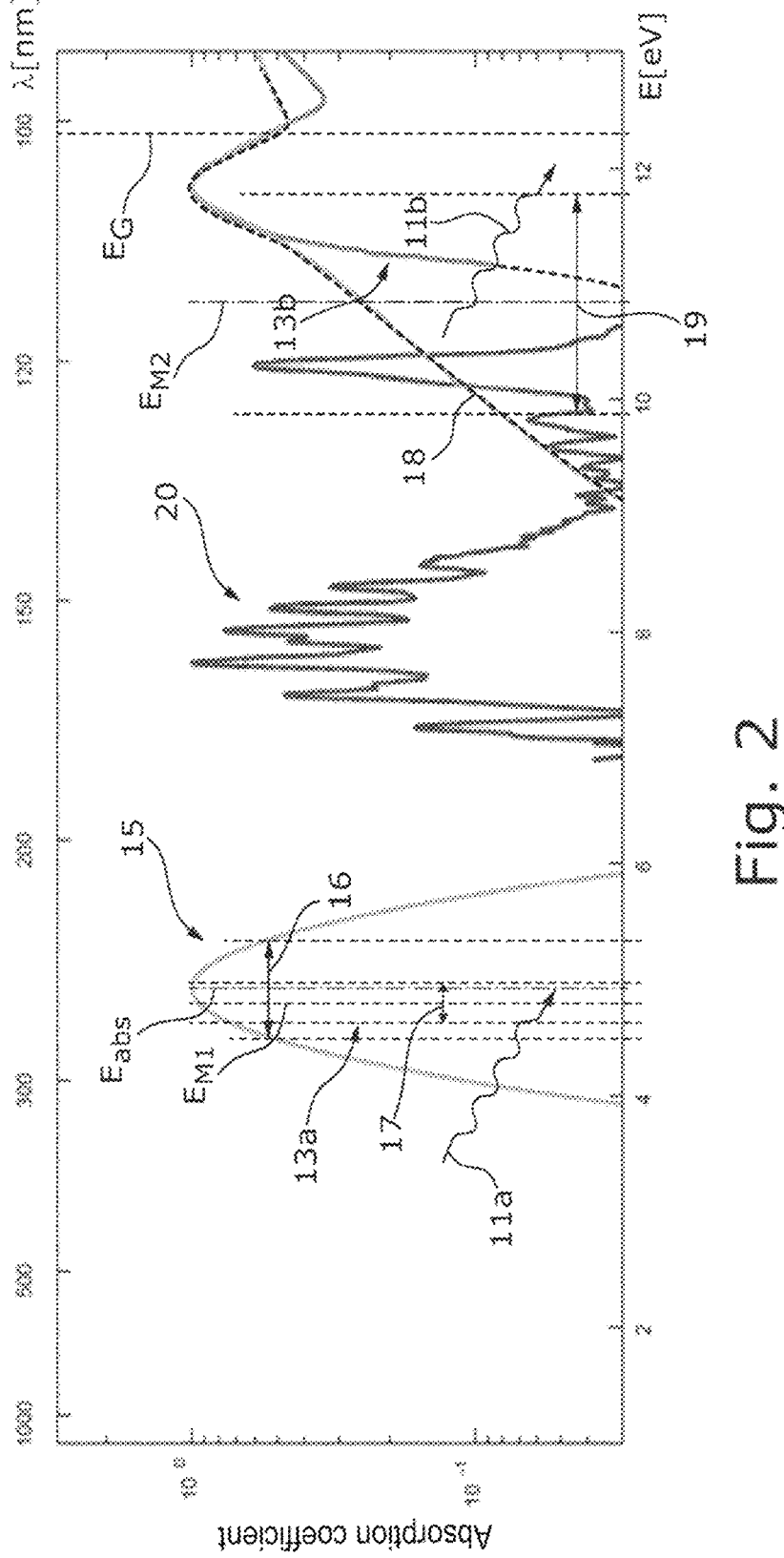
FIG. 2 shows the absorption spectrum of $MgF_2$ including an absorption range of an F-center, the two spectral ranges of the UV light from FIG. 1 and the emission spectrum of an Ar plasma.

An increased fluorine partial pressure may be advantageous if during the deposition, the layer 2 is irradiated with UV light 11a, 11b generated by a first and second UV light source 12a, 12b of the apparatus 1 shown in FIG. 1. In the example shown in FIG. 1, the first UV light source 12a is designed to emit UV light 11a in a first spectral range 13a, which serves for annealing crystal defects during the deposition. The second UV light source 12b is designed to emit UV light 11b in a second spectral range 13b, which serves for mobilizing atoms at the surface 2a of the ionically bonded solid or the layer 2. The two spectral ranges 13a, 13b are illustrated in FIG. 2 and are described in greater detail further below in association with FIG. 2.

In a departure from the illustration in FIG. 1, the apparatus 1 may have a single UV light source, which emits UV light 11a, 11b both in the first spectral range 13a and in the second spectral range 13b. The apparatus may also have only the first UV light source 12a, which emits UV light 11a in the first spectral range 13a, or only the second UV light source 12b, which emits UV light 11b in the second spectral range 13b. The apparatus 1 may also have more than two UV light sources.

In the example shown, both the first UV light source 12a and the second UV light source 12b are designed for emitting UV light 11a, 11b in fixed, predefined first and second spectral range 13a, 13b, respectively. However, it is also possible for the first and/or the second UV light source 12a, 12b to be tunable in order to be able to set or tune the first and/or the second spectral range 13a, 13b. In the example shown in FIG. 2, the first UV light source 12a is an Nd:YAG laser having a wavelength of 266 nm, and the second UV light source 12b is a $D_2$ lamp.

Alternatively, one or both light sources 12a, 12b may be designed for generating light in the visible wavelength range (VIS light). In this case, the light sources 12a, 12b may be designed for emitting VIS light in a predefined first and second spectral range 13a, 13b, respectively, or the light sources 12a, 12b may be designed to be tunable. Moreover, a single VIS light source may be designed to generate VIS light both in the first spectral range 13a and in the second spectral range 13b. One or a plurality of UV light sources and one or a plurality of VIS light sources may also be provided.

As is likewise discernible in FIG. 1, the two UV light sources 12a, 12b are protected from the interior of the coating chamber 4 by transmissive optical elements 14a, 14b. In the example shown, the transmissive optical elements 14a, 14b are lens elements, e.g., lenses composed of $MgF_2$ or $CaF_2$, which serve to focus or align the UV light 11a, 11b on the deposited layer 2 or on the substrate 3. As is discernible in FIG. 1, the optical axes of the two UV light sources 12a, 12b intersect at a common position Z in the center of the substrate 3. The coating source 7 and the plasma source 9 are likewise aligned with this common position Z. Instead of the transmissive optical elements 14a, 14b in the form of the lens elements, it is also possible to use windows, i.e., plane-parallel plates, in order to protect the UV light sources 12a, 12b from the interior of the coating chamber 4. Generally, the entire substrate 3 should be illuminated with the UV light 11a, 11b as homogeneously as possible.

FIG. 2 shows an absorption spectrum of an ionically bonded solid in the form of $MgF_2$ as a function of energy and wavelength. The absorption coefficient is plotted in arbitrary units in a logarithmic representation on the ordinate axis. Both the absorption spectrum of an $MgF_2$ single-crystal and the absorption spectrum of a thin $MgF_2$ layer are illustrated on the right-hand side in FIG. 2. These absorption spectra are discussed in detail in the article "Vacuum ultraviolet loss in magnesium fluoride films", O. R. Wood II et al., Appl. Opt. 23, 3644 (1984), which is hereby incorporated by reference in its entirety.

FIG. 2 likewise reveals an absorption range 16 of a crystal defect in the form of a color center 15, more precisely an F-center, of the deposited $MgF_2$ material. The color center 15 has an absorption energy $E_{abs}$ at which the absorption coefficient of the F-center is at a maximum. In the example shown, the wavelength corresponding to the absorption energy $E_{abs}$ is at approximately 260 nm or at approximately 4.77 eV. FIG. 2 likewise illustrates an absorption range 16 of the F-center 15, which is defined by a decrease to half the maximum value of the absorption coefficient (FWHM) at the absorption energy $E_{abs}$ of the F-center 15. In the example shown in FIG. 2, the absorption range 16 of the color center 15 lies between approximately 4.3 eV and approximately 5.25 eV.

As is discernible in FIG. 2, the first spectral range 13a has a mean energy $E_{M1}$ of approximately 4.66 eV, corresponding to a wavelength of approximately 266 nm. This mean energy $E_{M1}$ corresponds to the central wavelength of the first UV light source 12a, which lies in the center of the bandwidth 17 of the first spectral range 13a. In the example shown, the bandwidth 17 of the first spectral range 13a is approximately 0.5 eV.

The first spectral range 13a, serving for annealing the F-center 15, thus overlaps the absorption range 16 of the F-center 15; to put it more precisely, the first spectral range 13a lies completely within the absorption range 16 of the F-center 15. The first spectral range 13a therefore also comprises the absorption energy $E_{abs}$ of the F-center 15.

The mean energy $E_{M1}$ of the first spectral range 13a deviates from the absorption energy $E_{abs}$ only by 0.11 eV. This is advantageous in order to be able to instantaneously anneal the F-center 15 during the deposition of the layer 2. The bandwidth 16 of the first spectral range 13a should also be as narrow as possible for the annealing of the F-center 15 and should be set or settable to less than 1.5 eV, preferably to less than 0.75 eV. This is the case in the present example since the bandwidth (FWHM) of the first spectral range 13a is less than approximately 0.5 eV.

The selection of the first spectral range 13a, in particular the mean energy $E_{M1}$ of the first spectral range 13a, and optionally the bandwidth 17 thereof, is dependent on the absorption energy $E_{abs}$ of a respective crystal defect 15 of the deposited material in the form of the ionically bonded solid. Some other color center or some other crystal defect which is optically addressable or annealable may also be involved here instead of an F-center 15.

FIG. 3 shows the dependence of the absorption energy $E_{abs}$ of crystal defects on the anion-cation distance a for various fluorides.

Illustrated in FIG. 3 are the F-centers 15 of fluorides having a cubic crystal structure that follow the Mollwo-Ivey rule to a very good approximation, i.e., the relationship:

$$E_{abs} = Ca^{-n} \tag{1}$$

where C≈0.26 (with a in units of nm) and n≈1.8. As is discernible in FIG. 3, for example the absorption energy $E_{abs}$ of approximately 4.77 eV indicated further above results for $MgF_2$ in accordance with this rule.

For more complex crystal structures and/or other color centers, deviations from this rule arise, although the rule may continue to be used to a relatively good approximation. A more accurate description is obtained if the constant C and the exponent n in the power law (1) are adapted by way of, for example, a fit to the case under consideration.

On the basis of the absorption energy $E_{abs}$ of the crystal defect 15 that is determined approximately from the anion-cation distance a via the relationship, a suitable choice of the first spectral range 13a of the UV/VIS light 11a may be determined. The mean energy $E_{M1}$ of the UV/VIS light 11a required for regenerating or bleaching the crystal defects 15 may thus be estimated from the crystal structure of the materials to be deposited. This is advantageous since an excessively large deviation of the mean energy $E_{M1}$ of the first spectral range 13a from the absorption energy $E_{abs}$, in the worst case, cannot lead to the annealing of the crystal defects 15, but rather to the formation of new crystal defects 15, as will be described below with reference to FIGS. 4A and 4B.

Figures 4A, 4B:
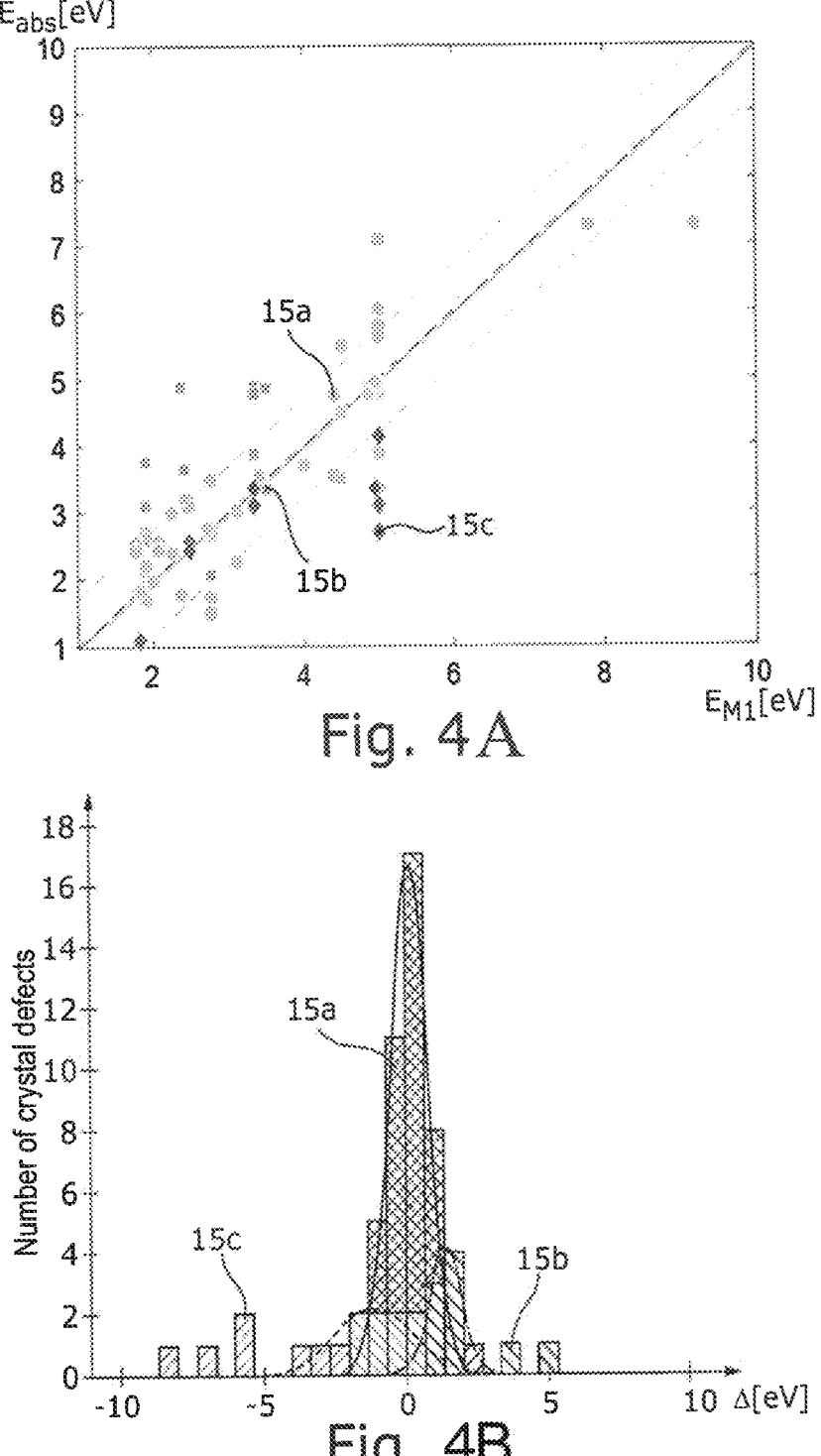
FIGS. 4A and 4B show the effect of the irradiation with UV/VIS light on crystal defects in fluorides as a function of the absorption energy of the crystal defects and the energy of the UV/VIS light.

FIG. 4A illustrates the effect of the irradiation with UV/VIS light 11a on crystal defects 15a-c in fluorides in a scatter diagram. The abscissa corresponds to the (mean) energy $E_{M1}$ of the UV/VIS light, and the ordinate corresponds to the absorption energy $E_{abs}$ of the crystal defect. In this case, the three different symbols stand for crystal defects which anneal as a result of the irradiation, crystal defects 15b which do not anneal as a result of the irradiation, and crystal defects 15c which are additionally produced by the irradiation. The total of seventy-three data points illustrated originate from a literature search.

FIG. 4B shows a histogram corresponding to FIG. 4A. In this case, the abscissa corresponds to the difference $\Delta = E_{abs} - E_{M1}$ between the absorption energy $E_{abs}$ of the crystal defect 15 and the mean energy $E_{M1}$ of the incident UV/VIS light 11a. The ordinate corresponds to the number of corresponding crystal defects 15a-c. For the annealable crystal defects 15a, the non-annealable crystal defects 15b and the additionally produced crystal defects 15c, three frequency distributions arise, which may be approximated by normal distributions. The mean values of the normal distributions are 0.2 eV (annealable crystal defects 15a), 1.4 eV (non-annealable crystal defects 15b) and −1.1 eV (additionally produced crystal defects 15c). The full width at half maximum values are 1.6 eV (annealable crystal defects 15a), 1.4 eV (non-annealable crystal defects 15b) and 3.3 eV (additionally produced crystal defects 15c).

FIG. 4A and FIG. 4B reveal that increased production of additional crystal defects 15c occurs if the mean energy $E_{M1}$ of the UV/VIS light 11a is significantly greater, typically at least 1 eV or 1.5 eV greater, than the absorption energy $E_{abs}$ of the crystal defect 15. It is therefore advantageous to impose an upward limitation on the spectrum of the energy of the first spectral range 13a of the UV/VIS light 11a and in particular the mean energy $E_{M1}$. Specifically, the mean energy $E_{M1}$ should not be more than 1 eV greater, preferably not more than 1.5 eV greater, than the absorption energy $E_{abs}$ of the crystal defect 15 that is to be annealed. FIG. 4A and FIG. 4B additionally reveal that no annealing is possible if the (mean) energy $E_{M1}$ of the UV/VIS light 11a used during the irradiation is significantly less than the absorption energy $E_{abs}$ of the respective crystal defect 15.

As also described above, FIG. 2 illustrates on the right-hand side the absorption coefficient in the range of the conduction band of $MgF_2$ with a bandgap energy $E_G$ or a band edge of the conduction band. In this case, a solid line represents the profile of the absorption coefficient in a monocrystalline $MgF_2$ material, and a dashed line represents the absorption coefficient of a thin layer 2 composed of $MgF_2$ material, such as is deposited with the aid of the apparatus 1 shown in FIG. 1. In the case of a thin layer composed of $MgF_2$, the absorption coefficient tails off exponentially toward lower energies in a so-called Urbach tail 18. Below the bandgap energy $E_G$, which is approximately 12.3 eV, excitonic states are excited, e.g., the 1 s exciton state, in which the absorption coefficient is at a maximum.

As is likewise discernible in FIG. 2, during the deposition, UV light 11b in a second spectral range 13b is radiated onto the layer 2 or onto the deposited material of the layer 2. The second spectral range 13b typically lies in an energy range of between 75% and 100% of the bandgap energy $E_G$ of $MgF_2$. In the example shown, the second spectral range 13b lies between 9.84 eV and 11.8 eV, i.e., in an energy range of between 80% and 95% of the bandgap energy $E_G$ of the deposited $MgF_2$ material. The bandwidth 19 of the second spectral range 13b is thus approximately 1.96 eV, and the mean energy $E_{M2}$ of the second spectral range 13b is approximately 10.82 eV. The incidence of UV light 11b in the second spectral range 13b at or just below the band edge energy $E_G$ serves for mobilizing atoms at the surface 2a of the layer 2 of the $MgF_2$ material.

The irradiation with UV light 11b in the second spectral range 13b during deposition typically likewise leads to a lower extinction coefficient of the deposited layer 2. A possible mechanism here is the greater ease with which Ehrlich-Schwöbel barriers are overcome by the mobilized atoms, which makes it possible to produce larger grains and fewer grain boundaries during the deposition, which leads to a lower extinction coefficient.

An intensity $I_1$ of the UV light 11a in the first spectral range 13a must be set such that the rate at which the crystal defects 15 anneal is greater than the generation rate at which new crystal defects 15 arise. The generation rate of defect formation is also correlated with the VUV-driven single-photon processes. If UV light 11b in the second spectral range 13b near the band edge energy $E_G$ of the ionically bonded solid is used for irradiation, it is advantageous to increase the intensity $I_1$ emitted by the first UV light source 12a in the first spectral range 13a relative to an intensity $I_2$ of the intensity $I_2$ emitted by the second UV light source 12b in the second spectral range 13b. The ratio between the intensity $I_1$ of the UV light 11a in the first spectral range 12a and the intensity $I_2$ of the UV light 11b in the second spectral range 13b is advantageously more than 3:1, in particular more than 6:1.

As explained further above, an ion-assisted process and/or a plasma-assisted process may be used for depositing layers 2 having a high density. In the case of ion-assisted deposition, crystal defects 15 are also produced by the ion bombardment. These crystal defects 15 are intended substantially to be annealed by the UV light 11a that is radiated in the first spectral range 13a onto the layer 2. In the case of a plasma-assisted process, it should be taken into consideration that the plasma likewise emits radiation in the UV/VUV wavelength range. FIG. 2 shows, by way of example, the emission spectrum 20 of a plasma for an argon-based RF-pumped "cylindrical dielectric barrier discharge" process, which was taken from the article "VUV emission from a cylindrical dielectric barrier discharge in Ar and in Ar/N₂ and Ar/air mixtures", N. Masoud et al., J. Phys. D 38, 1674-1683 (2005). The radiation of such a plasma, which is generated by the plasma source 9 illustrated in FIG. 1, may likewise cause crystal defects 15 in the layer 2 to be deposited by way of single-photon processes. In this regard, the emission spectrum 20 shown in FIG. 2 overlaps the Urbach tail 18 of the thin $MgF_2$ layer 2. However, parts of the radiation emitted by the plasma may also have a regenerating effect.

One or a plurality of layers 2 having a low extinction coefficient and optionally a high density may be deposited onto the substrate 3 in the manner described above. The deposited layers 2 may fulfil various functions, for example a protective function for the substrate 3 or for underlying layers, a reflective function or an antireflective function, etc. The substrate 3 coated with one or a plurality of layers 2 may form an optical element designed for transmitting and/or for reflecting radiation in the VUV wavelength range. Such a transmissive and/or reflective optical element may be used in various optical arrangements for the VUV wavelength range. The reflective optical element may be a mirror, for example, and a transmissive and reflective optical element may be a beam splitter, etc.

Figures 5, 6, 7:
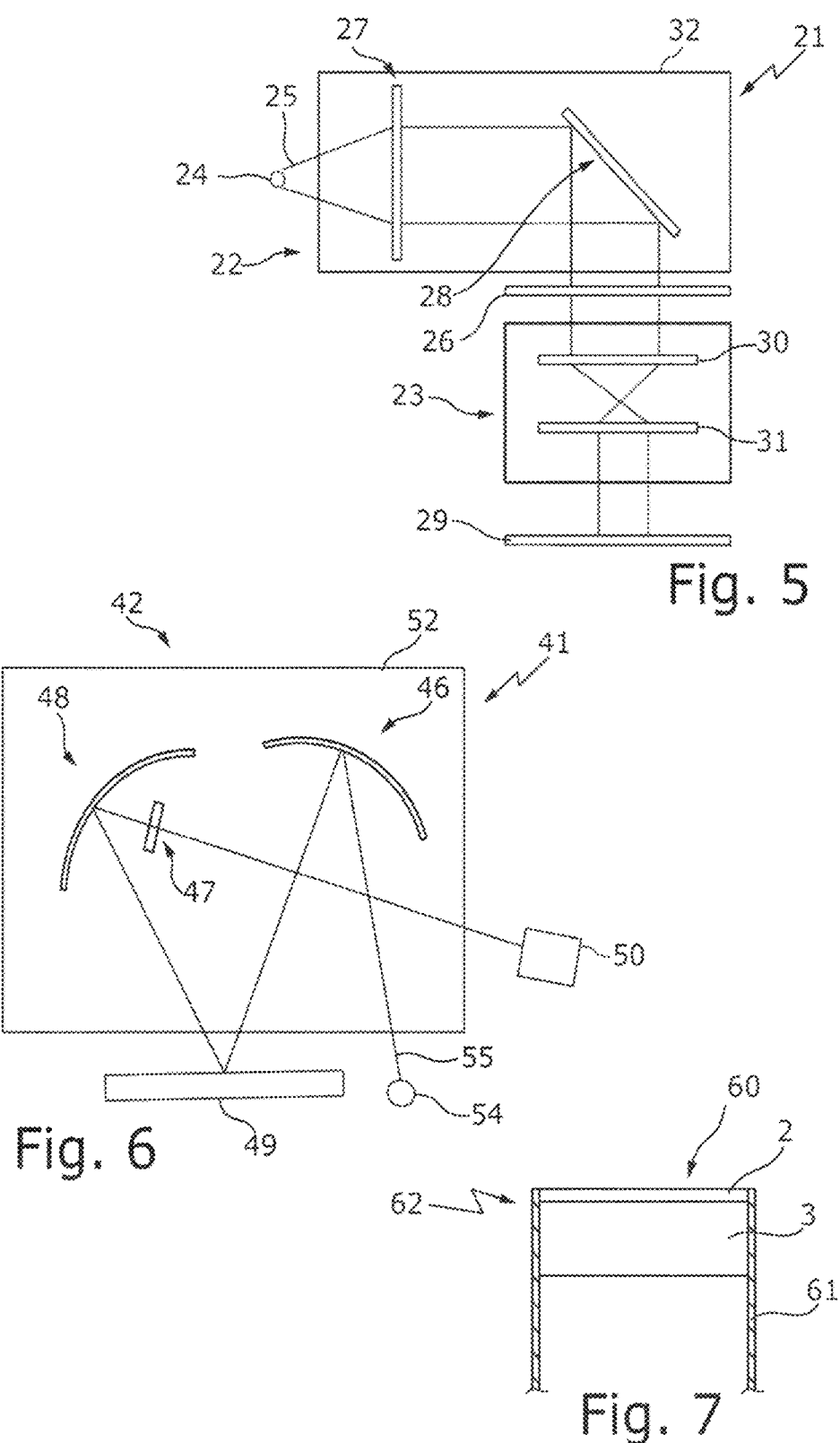
FIG. 5 shows a schematic illustration of an optical arrangement for the VUV wavelength range in the form of a VUV lithography apparatus.
FIG. 6 shows a schematic illustration of an optical arrangement for the VUV wavelength range in the form of a wafer inspection system.
FIG. 7 shows a schematic illustration of an optical element in the form of a laser chamber window.

FIG. 5 shows an optical arrangement for the VUV wavelength range in the form of a VUV lithography apparatus 21. The VUV lithography apparatus 21 includes two optical systems, namely an illumination system 22 and a projection system 23. The VUV lithography apparatus 21 additionally has a radiation source 24, which may be an excimer laser, for example.

The radiation 25 emitted by the radiation source 24 is conditioned with the aid of the illumination system 22 such that a mask 26, also called a reticle, is illuminated thereby. In the example shown, the illumination system 22 has a housing 32, in which both transmissive and reflective optical elements are arranged. In a representative manner, the illustration shows a transmissive optical element 27, which focuses the radiation 25, and a reflective optical element 28, which deflects the radiation.

The mask 26 has, on its surface, a structure which is transferred to an optical element 29 to be exposed, for example a wafer, with the aid of the projection system 23, for the purpose of producing semiconductor components. In the example shown, the mask 26 is designed as a transmissive optical element. In alternative examples, the mask 26 may also be designed as a reflective optical element.

The projection system 22 has at least one transmissive optical element in the example shown. The example shown illustrates, in a representative manner, two transmissive optical elements 30, 31, which serve to, for example, reduce the structures on the mask 26 to the size desired for the exposure of the wafer 29.

Both in the illumination system 22 and in the projection system 23, a wide variety of transmissive, reflective or other optical elements may be combined with one another in an arbitrary, even more complex, manner. Optical arrangements without transmissive optical elements may also be used for VUV lithography.

FIG. 6 shows an optical arrangement for the VUV wavelength range in the form of a wafer inspection system 41, but a mask inspection system may also be involved. The wafer inspection system 41 has an optical system 42 with a radiation source 54, from which the radiation 55 is directed onto a wafer 49 via the optical system 42. For this purpose, the radiation 55 is reflected onto the wafer 49 by a concave mirror 46. In the case of a mask inspection system, a mask to be examined could be arranged instead of the wafer 49. The radiation reflected, diffracted and/or refracted by the wafer 49 is directed onto a detector 50 for further evaluation by a further concave mirror 48, which is likewise associated with the optical system 42, via a transmissive optical element 47. The wafer inspection system 41 additionally has a housing 52, in which the two mirrors 46, 48 and the transmissive optical element 47 are arranged. The radiation source 54 may be, for example, one radiation source or a combination of a plurality of individual radiation sources in order to provide a substantially continuous radiation spectrum. In modifications, one or more narrowband radiation sources 54 may also be used.

At least one of the optical elements 27, 28, 30, 31 of the VUV lithography apparatus 21 shown in FIG. 5 and at least one of the optical elements 46, 47, 48 of the wafer inspection system 41 shown in FIG. 6 are designed as described above. They are thus coated with at least one layer 2 composed of an ionically bonded solid, for example a fluoride or an oxide, wherein the at least one layer 2 was deposited according to the method described further above and/or via the apparatus 1 described further above.

FIG. 7 shows an optical element for transmitting radiation in the VUV wavelength range in the form of a laser chamber window 60 of a laser chamber 61 of an excimer laser 62. The laser beam emitted by the excimer laser 62 passes to the outside through the laser chamber window 60. The exterior of the laser chamber window 60 is coated with a layer 2 composed of an ionically bonded solid, for example a fluoride layer, which was deposited according to the method described further above and/or via the apparatus 1 described further above. The layer 2 was irradiated with UV/VIS light 11*a*, 11*b* during deposition and therefore simultaneously has a high density and a low extinction coefficient. Sealing with such a layer 2 counteracts degradation of the laser chamber window 60 and thus prolongs the lifetime thereof.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. A method for depositing by physical vapor deposition at least one layer composed of an ionically bonded solid on a substrate, comprising:

converting a coating material to a gas phase;

depositing the coating material converted to the gas phase on the substrate forming the ionically bonded solid on the substrate; and irradiating the coating material converted to the gas phase with UV/VIS light during the depositing, wherein the UV/VIS light comprises a first spectral range for annealing at least one crystal defect of the ionically bonded solid by removing electrons from the crystal defects, wherein the first spectral range at least partly overlaps an absorption range of the at least one crystal defect, wherein the first spectral range comprises an absorption energy of the at least one crystal defect, and wherein a mean energy of the first spectral range deviates from the absorption energy of the at least one crystal defect by 0.5 eV or less, and wherein the UV/VIS light comprises a second spectral range for mobilizing atoms at a surface of the ionically bonded solid, the second spectral range lying in an energy range of between 75% and 100% of a bandgap energy of the ionically bonded solid.

2. The method as claimed in claim 1, wherein the mean energy of the first spectral range deviates from the absorption energy of the at least one crystal defect by 0.25 eV or less.

3. The method of claim 1, wherein the at least one crystal defect forms a color center.

4. The method of claim 1, wherein the first spectral range is chosen based on a relationship between the absorption energy of the at least one crystal defect and an anion-cation distance of the ionically bonded solid.

5. The method of claim 1, wherein the mean energy of the first spectral range is greater than the absorption energy of the at least one crystal defect by 1 eV or less.

6. The method of claim 1, wherein the mean energy of the first spectral range or a mean energy of the second spectral range is less than 0.5 eV of a bandwidth of the first spectral range, or a bandwidth of the second spectral range is restricted to less than 1.5 eV.

7. The method of claim 1, wherein a ratio between an intensity of the UV/VIS light in the first spectral range and an intensity of the UV/VIS light in the second spectral range is more than 3:1.

8. The method of claim 1, wherein the ionically bonded solid is a fluoride or an oxide.

9. The method of claim 1, wherein the depositing comprises a plasma-assisted and/or ion-assisted deposition.

10. The method of claim 1, wherein the depositing is carried out in the presence of at least one reactive gas.

11. The method of claim 10, wherein the at least one reactive gas is selected from the group comprising: $F_2$, $O_2$, $NF_3$, $XeF_2$, $SF_6$, $CF_4$, and $NH_3$.

12. The method of claim 11, wherein the depositing is carried out at a pressure in a range of between $10^{-6}$ mbar and $10^{-2}$ mbar.

* * * * *